United States Patent [19]

Frederiksen et al.

[11] 4,307,338
[45] Dec. 22, 1981

[54] LASER ALIGNMENT DETECTOR

[75] Inventors: Thomas M. Frederiksen; Joseph J. Connolly, Jr., both of San Jose, Calif.

[73] Assignee: National Semiconductor Corporation, Santa Clara, Calif.

[21] Appl. No.: 863,280

[22] Filed: Dec. 22, 1977

[51] Int. Cl.³ .................................. G01R 27/02
[52] U.S. Cl. ........................... 324/65 R; 219/121 L; 250/491; 318/640; 356/152
[58] Field of Search ......... 324/65 R; 219/122, 121 L, 219/121 LM; 250/491; 318/640, 652; 340/524; 356/152, 172; 235/92 EC

[56] References Cited

U.S. PATENT DOCUMENTS

| 3,388,461 | 6/1968 | Lins | 219/121 L |
| 3,423,589 | 6/1969 | Bardwell et al. | 318/640 X |
| 3,448,280 | 6/1969 | Blitchington, Jr. et al. | 219/121 L |
| 3,699,649 | 10/1972 | McWilliams | 219/121 L X |
| 3,739,247 | 6/1973 | Yamaguchi et al. | 318/640 |
| 3,758,745 | 9/1973 | Wilker et al. | 219/121 LM |

Primary Examiner—Stanley T. Krawczewicz
Attorney, Agent, or Firm—Gail W. Woodward; James A. Sheridan

[57] ABSTRACT

A detector for application to integrated circuits useful in determining the alignment of a trimming laser. A metallization pattern is employed along with electrical detection circuitry to determine when the trimming laser becomes misaligned by a predetermined amount. The laser is precision aimed when the integrated circuit wafer is located in a step and repeat machine. As stepping continues the detector provides an indication when the cumulative error exceeds the predetermined value.

7 Claims, 4 Drawing Figures

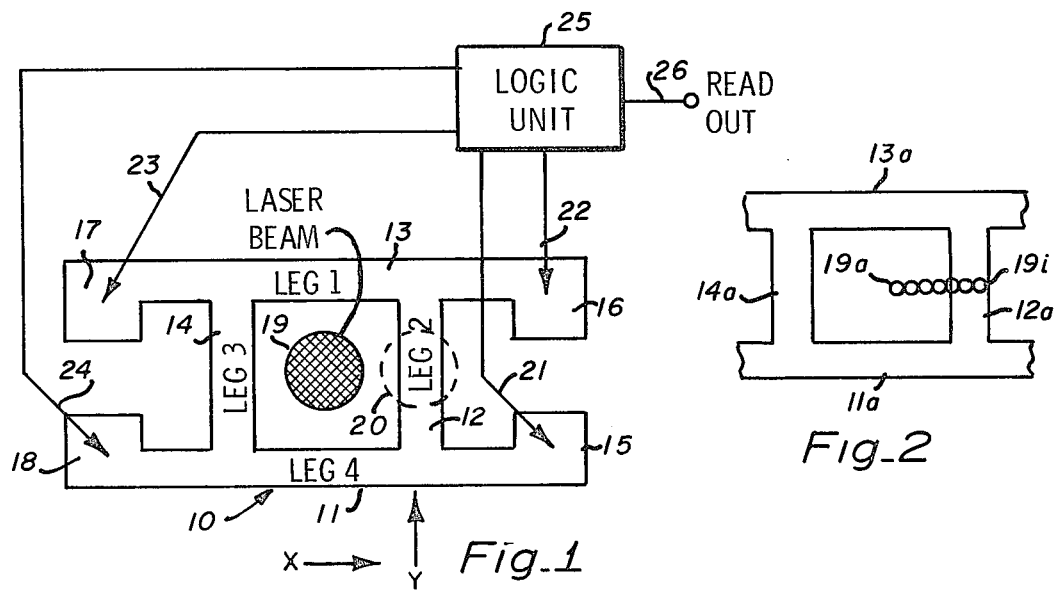
Fig_1
Fig_2
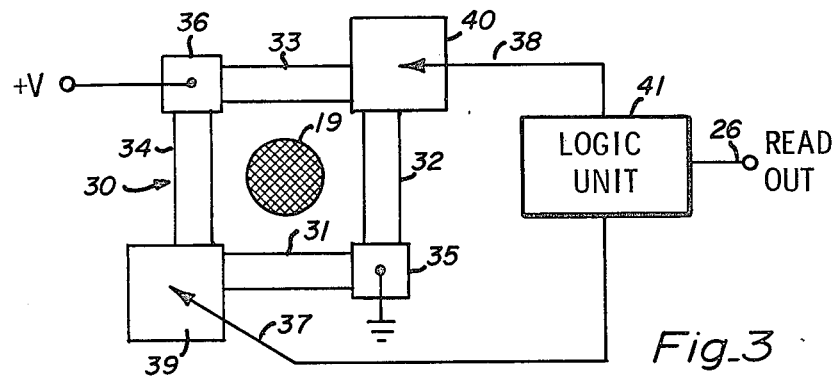
Fig_3
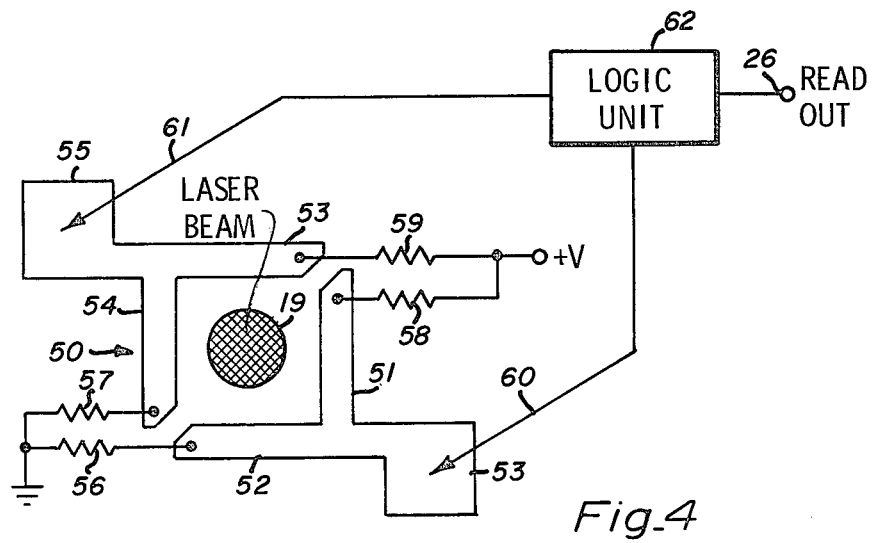
Fig_4

LASER ALIGNMENT DETECTOR

BACKGROUND OF THE INVENTION

Energy beams are often used in the shaping of workpieces in industrial fabrication processes. For example, electron beam machining has been used in the fabrication of small intricately shaped parts. With the development of the laser it has become the most widely used energy beam device in such fabrication processes. In the electronics industry, semiconductor monolithic integrated circuits (ICs) are conventionally trimmed with focused laser beams on a mass production basis. As indicated in U.S. Pat. No. 3,584,183 a pulsed laser is used to trim the diodes that form an integrated circuit matrix to generate a desired encoding pattern. In application Ser. No. 830,979 filed Sept. 6, 1977, Robert F. Johnson, and assigned to the assignee of the present invention, laser trimming of active IC elements is described. In application Ser. No. 860,927 filed Dec. 15, 1977 by Robert A Cometta, and assigned to the assignee of the present invention, the application of a pulsed laser to a step and repeat IC wafer production process is shown.

Typically the laser trimming processes employ energy beams that are not visible and therefore aiming such beams becomes a problem. Typically a visible aiming light beam is transmitted coaxially with the invisible working beam and is normally left on while the invisible beam is not energized. The visible spot will then define the point of impingement of the invisible beam when it is turned on. Such aiming requires careful alignment of the two beams and visual observation or some other means for monitoring the visible beam. Alternatively the working beam can be directed to an unused substrate portion and its effect rendered visible on the substrate. One such means is to locate a target area on the subject substrate and to direct the working beam to a reference point. The area to be worked is related by precisely known coordinates and once the target area is impacted, the working area can be directed precisely.

As described in application Ser. No. 860,927 filed Dec. 15, 1977, now U.S. Pat. No. 4,182,024, an IC wafer is located in a step and repeat machine which indexes the semiconductor IC wafer to successively bring each one of the plurality of IC devices located thereon under the influence of the trimming laser. Once a wafer is precision oriented and located in such a machine, the step and repeat function will precisely index the wafer, one circuit at a time, until each one of the wafer is treated. While the stepping operation is very good, it is not perfect and small cumulative error in indexing occurs. Also, if the wafer has a rotational misalignment, a cumulative error can result in a direction normal to the direction of the stepping operation. Thus while the first circuit is precisely aligned with the aimed laser, subsequently treated circuits will be less precisely aligned. Where the cumulative error in either direction exceeds a tolerable limit, the laser must be re-aimed before proceeding. It would be desirable to make this operation automatic. Thus it would be desirable to be able to detect laser misalignment.

SUMMARY OF THE INVENTION

It is an object of the invention to provide a laser beam detector that is located on an intergrated circuit and provides an indication of a predetermined amount of misalignment.

It is a further object of the invention to provide a laser misalignment detector that indicates the direction of the misalignment.

These and other objects are achieved by adding a simple metallization pattern to each integrated circuit on a wafer. The pattern includes a ring of metal surrounding the area of desired laser beam impingement. When the laser beam interacts with the pattern, an indication can be provided when a pre-determined misalignment is present. In one embodiment the ring of metallization is in the form of a rectangle and the four corners connected to measurement circuitry. When the laser severs one of the legs of the ring, an indication is available of the misalignment direction, the pattern size establishes the misalignment value to be indicated. If desired, the line width of the metal forming the ring can be made small with respect to the laser beam size. In this case, a single laser shot can act to sever the line when the beam is misaligned. In the case where the laser beam is small with respect to the width of the metal, the laser is repetitively pulsed and translated to produce a series of ovelapping pulses. When the pulses train severs the metal, an indication is available to establish the precise movement which was required.

If desired, the pattern can be created using resistance material for the metallization and contacts made to spaced regions around the ring. In this case, the ring does not have to be completely severed to determine the laser beam position with precision.

BRIEF DESCRIPTION OF THE DRAWING

FIG. 1 shows a metallization pattern using a metallization ring and four pads to which probe contact is made;

FIG. 2 shows a version of the ring of FIG. 1 in which the metal width is greater than the laser beam diameter;

FIG. 3 is an alternative embodiment of the metallization pattern using resistance material and a two-probe measurement; and FIG. 4 is an alternative embodiment of metallization pattern using conductive metal or resistance material and a two-probe measurement.

DESCRIPTION OF THE INVENTION

FIG. 1 shows a laser target pattern 10 for incorporation into a semiconductor integrated circuit. The outline is in the form of a metallization pattern shown as having four legs 11-14, forming four sides of a square. Four contact pads 15-18 are connected to the four corners of the square. The width of the lines forming the square is made less than the diameter of laser beam 19 and the inner dimension of the square is made larger than the laser beam as shown. The metallization pattern is typically located on top of the oxide normally present on a silicon monolithic integrated circuit wafer. The pattern is precision located with respect to the circuit and is created as part of the wafer fabrication process. Thus locating the laser beam inside the square locates the beam with respect to the circuit.

In the laser machining of IC wafers, the usual practice is to use the laser to vaporize or remove metallization. Typically, aluminim or aluminum-silicon alloy metal is to be removed. Alternatively, a resistance material such as silicon-chromium or nickelchromium might be employed. Ideally the laser energy is adjusted to remove the metal without any effect upon the underlayers of silicon or silicon oxide.

In the IC wafer sort testing, the wafer is mounted in a step and repeat machine and incremented one circuit element at a time. The individual circuit is measured and then trimmed to achieve the desired performance. While such machines operate at high precision, some error is present. A small error in stepping accumulates so that after several steps the error can be substantial. If each circuit were to contain a pattern, such as pattern 10, and the laser initial aiming point located in the center of the square as shown, firing the laser will have no effect on the pattern. As the step and repeat error accumulates, the laser beam will appear to walk toward one edge of the square. Dashed beam pattern 20 will occur when the cumulative error is such that the laser beam spans the metal line. Firing the laser for this condition will sever leg 12. To sense the state of the metalization, four contact probes, 21-24, are located on the step and repeat machine along with the conventional measurement probes. The probes 21-24 are arranged to mate with pads 15-18. The probes are coupled to a logic unit 25. The logic unit looks for the adjacent pad pair displaying the highest resistance. When leg 12 is severed, the highest resistance will be measured between pads 15 and 16. The readout of 26 will then indicate that the laser beam has been displaced to the right. When this condition is sensed, the cumulative error is equal roughly to one half of the size of the square. Typically, the laser beam will be re-aimed by this dimension to the left (by means not shown). Thus the pattern can be used to sense an aiming error of known amount and the information used to correct the error.

Typically the error detected by legs 12 and 14 will be used to sense or correct horizontal or x-direction errors and legs 11 and 13 used to sense or correct vertical or y-direction errors.

FIG. 2 shows a target pattern in which the laser beam is smaller than the width of the pattern legs. In FIG. 1, a single laser pulse will sever a leg when it spans the leg. In FIG. 2, legs 12a-14a are several beam diameters across. This target is useful when a repetitively pulsed laser is translated less than one beam diameter per pulse. The pulse shown at 19a represents the initial aiming point. Pulse 19i is shown as the last pulse in a string of nine pulses. The first pulse striking leg 12a will have little effect. In fact, since aluminum metallization is highly conductive, the leg will have to be completely severed by pulse 19i before a substantial change will be observed. Thus the system of FIGS. 1 and 2 is designed to detect when the laser beam has completely severed the pattern leg and thus is most useful in indicating the outer diameter of the square pattern.

The patterns of FIGS. 1 and 2 are operative but the logic unit 25 is required to sense very small resistance changes. This means that very reliable probe contacts must be employed on all four probes. To make sensing easier, the embodiment of FIG. 3 can be used. Here pattern 30 includes four legs 31-34, which are composed of resistance material such as nichrome, sichrome, tantalum, or the like. The material is selected to be severable or volatilized by the laser as normally used in circuit fabrication. Two opposing corners of the square are coupled via normal IC connections 35 and 36 to circuit ground and a potential point (+v) respectively on the associated IC. A single pair of probes 37 and 38 contact metallization pads 39 and 40 respectively on the other two corners of the square, and couple to logic unit 41. In this case, logic unit 41 simply looks at the potentials at pads 39 and 40. For an intact square pads 39 and 40 will be at approximately +V/2 and equal. If leg 32 is severed, pad 40 will rise to +V. If leg 33 is severed, pad 40 will fall to ground potential. If leg 34 is severed, pad 39 will fall to ground potential. If leg 3i is severed, pad 39 will rise to +V. In this embodiment the logic unit is presented with large signals, only two probes are needed, and probe contact is non-critical in the measurement.

While the FIG. 3 embodiment shows the width of the legs as being smaller than a beam diameter, this is not necessary. The pattern can be operated as was shown in FIG. 2. Furthermore, since the legs are actually resistors, their value will start to rise as soon as the laser beam strikes their inner edge. The resistance will increase as the laser beam is displaced until the leg is completely severed. Accordingly, if logic unit is made sensitive enough, it can readily sense when the laser beam is only part way through the pattern leg.

FIG. 4 represents an alternative embodiment in which metallization of the kind used in the integrated circuit is used yet the advantages of the two probe system are retained. Pattern 50 is similar to that in FIG. 1 except that two opposing pads are replaced with gaps in the metallization. Legs 51 and 52 are joined to pad 53. Legs 53 and free ends of legs 51 and 53 are coupled by means of resistors 58 and 59 respectively to a potential point (+V) in the IC. Resistors 56-59 can be diffused into the IC or in the form of thin film deposited devices. They can be of almost any value desired and are desirably equal in value. When the metallization is intact, pads 53 and 55 will both be at a potential of about +V/2. Severing leg 51 will cause pad 53 to drop to ground. Serving leg 53 will cause pad 55 to drop to ground. Severing leg 52 will cause pad 53 to rise to +V. Severing leg 54 will cause pad 55 to rise to +V. Thus probes 60 and 61 coupled to logic unit 62 will respond to large signal swings at pads 53 and 55 so that logic level is easily recognized and probe contact is not critical.

As was the case in FIG. 1, FIG. 4 shows legs that are narrower than a beam diameter across and are severed when the laser beam spans the leg. This construction will also work well with beam diameters smaller than the leg width when multiple laser pulses are employed as described above in connection with FIG. 2. Furthermore, if desired, the resistance metal embodiments can employ shallow diffused or ion implanted regions of the semiconductor with contact being made through holes in the passivating oxide. As shown in patent application Ser. No. 830,979 filed Sept. 6, 1977, such regions can be laser trimmed.

The drawing shows square detector element configurations. This yields equal x and y sensitivity and is easy to lay out. If desired, the pattern could be of some other rectangular form. For example, if a reduced x sensitivity is desired, the pattern size in the x dimension could be increased. Additionally, the square form could be replaced with a circular pattern. The unequal side rectangular form could be replaced with an oval pattern.

The invention has been described and several useful embodiments disclosed. Clearly there will be other alternatives and equivalents within the spirit and intent of the invention that will occur to a person skilled in the art. Accordingly, it is intended that the scope of the invention be limited only by the claims that follow.

We claim:

1. A detector for sensing when the impingement point of a localized energy beam on a substrate exceeds a predetermined misalignment from a desired impingement area, said detector comprising:

electrically conductive strip means divided into four segments defining four sides of said area and located in insulated relationship on said substrate to substantially completely form a ring surrounding the periphery of said area of desired impingement of said beam, said electrically conductive means being composed of a material that is electrically alterable by said beam; and sensing means comprising electrical connections to each end of each of said segments for sensing the impingement of said beam on said electrically conductive means to indicate the presence of said predetermined misalignment wherein each segment senses an error in said impingement point in a different direction.

2. The detector of claim 1 wherein said segments and said connections comprise the same material.

3. The detector of claim 1 wherein said segments are made of a material having a resistance substantially greater than that of said connections.

4. The detector of claim 1 wherein said segments are of substantially the same length.

5. The detector of claim 4 wherein said sensing means includes means for comparing the conductivity of adjacent segments.

6. The detector of claim 2 wherein said sensing means responds to severance of one of said segments.

7. The detector of claim 3 wherein said sensing means responds to a change of resistance of one of said segments.

* * * * *